United States Patent
Hong et al.

(10) Patent No.: US 10,177,301 B2
(45) Date of Patent: Jan. 8, 2019

(54) METHOD OF PROMOTING ELECTRIC OUTPUT OF PIEZOELECTRIC/CONDUCTIVE HYBRID POLYMER AND FABRICATING METHOD OF PIEZOELECTRIC/CONDUCTIVE HYBRID POLYMER THIN FILM

(71) Applicant: NATIONAL TSING HUA UNIVERSITY, Hsinchu (TW)

(72) Inventors: Chien-Chong Hong, Hsinchu County (TW); Tong-Miin Liou, Hsinchu (TW); Kai-Lun Lin, New Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 1106 days.

(21) Appl. No.: 14/265,384

(22) Filed: Apr. 30, 2014

(65) Prior Publication Data
US 2015/0188032 A1 Jul. 2, 2015

(30) Foreign Application Priority Data
Dec. 27, 2013 (TW) .............................. 102148724 A

(51) Int. Cl.
*H01L 41/193* (2006.01)
*H01L 41/45* (2013.01)
(Continued)

(52) U.S. Cl.
CPC .......... *H01L 41/193* (2013.01); *H01L 41/253* (2013.01); *H01L 41/317* (2013.01); *H01L 41/45* (2013.01)

(58) Field of Classification Search
CPC ......... H01L 41/35; H01L 41/37; H01L 41/45; H01L 41/253; H01L 41/317
See application file for complete search history.

(56) References Cited

U.S. PATENT DOCUMENTS 8,632,717 B2  1/2014 Hong et al.
2010/0181871 A1*  7/2010 Daniel .................. G01L 1/16
                                                        310/338
(Continued)

FOREIGN PATENT DOCUMENTS

TW  201249738 A  12/2012
TW  201307359 A   2/2013
(Continued)

OTHER PUBLICATIONS

Chien-Chong Hong, Alan Chen, Tong-Miin Liou, Piezoelectric Device, U.S. Appl. No. 13/923,061, filed Jun. 20, 2013.
(Continued)

*Primary Examiner* — Christopher T Schatz
(74) *Attorney, Agent, or Firm* — CKC & Partners Co., Ltd.

(57) ABSTRACT

A method of fabricating a piezoelectric/conductive hybrid polymer thin film is provided, which is promoting an electric output of a piezoelectric polymer and includes: a mixing step including: forming a piezoelectric solution by dissolving a PVDF-TrFE in an active solvent; forming a conductive solution by dissolving a PEDOT:PSS in a water; and forming a piezoelectric/conductive hybrid polymer solution by mixing the piezoelectric solution and the conductive solution; a filming step, wherein the piezoelectric/conductive hybrid polymer solution is heated, thus the piezoelectric/conductive hybrid polymer thin film is formed; and an anneal step, wherein the piezoelectric/conductive hybrid polymer thin film is recrystallized and a nano-sized protruding structure is formed on a surface of the piezoelectric/conductive hybrid polymer thin film.

18 Claims, 18 Drawing Sheets

(51) Int. Cl.
  *H01L 41/253* (2013.01)
  *H01L 41/317* (2013.01)

(56) References Cited

U.S. PATENT DOCUMENTS

2011/0193262 A1  8/2011  Hong et al.
2013/0319522 A1  12/2013  Asahi

FOREIGN PATENT DOCUMENTS

| TW | I396659 B | 5/2013 |
| TW | 201334250 A | 8/2013 |
| WO | 2010104196 A1 | 9/2010 |
| WO | 2013120591 A2 | 8/2013 |

OTHER PUBLICATIONS

Chien-Chong Hong et al., Enhanced Piezoelectricity of Nanoimprinted Sub-20 nm Poly(vinylidene fluoride-trifluoroethylene) Copolymer Nanograss, Macromolecules, 45, pp. 1580-1586, Jan. 30, 2012.
Chunyan Li et al., Flexible dome and bump shape piezoelectric tactile sensors using PVDF-TrFD copolymer, Journal of Microelectromechanical Systems, vol. 17, No. 2, Apr. 2008, pp. 334-341.
Rachid Hadji et al., Preparation and Characterization of P(VDF-TrFE)/Al2O3 Nanocomposite, IEEE Transactions on Ultrasonics, Ferroelectrics, and Frequency Control, vol. 59, No. 1, Jan. 2012, pp. 163-167.
John S. Dodds et al., Piezoelectric Characterization of PVDF-TrFE Thin Films Enhanced With ZnO Nanoparticles, IEEE Sensors Journal, vol. 12, No. 6, Jun. 2012, pp. 1889-1890.

* cited by examiner

METHOD OF PROMOTING ELECTRIC OUTPUT OF PIEZOELECTRIC/CONDUCTIVE HYBRID POLYMER AND FABRICATING METHOD OF PIEZOELECTRIC/CONDUCTIVE HYBRID POLYMER THIN FILM

RELATED APPLICATIONS

This application claims priority to Taiwan Application Serial Number 102148724, filed Dec. 27, 2013, which is herein incorporated by reference.

BACKGROUND

Technical Field

The present disclosure relates to a method of fabricating a piezoelectric/conductive polymer hybrid polymer thin film, and a method of promoting an electric output of a piezoelectric/conductive hybrid polymer.

Description of Related Art

Piezoelectric material is a type of the electric material which is capable of electric to mechanical energy conversion. It is applied to sensors, energy converters, and actuators based on a converse piezoelectric effect which is related to a mechanical transformation with an electric field, and on a direct piezoelectric effect which is related to converting mechanical energy to electric energy.

There are two types of piezoelectric material, namely, polymer and inorganic. At present, the research direction in the field of piezoelectric polymer material is focused on PVDF (polyvinylidene fluoride). The PVDF-based member group of piezoelectric polymer material has the advantages of low resistance, low density, high malleability, easy processing and low cost, thereby resulting in rapid development. However, the PVDF-based member group of piezoelectric polymer material has a lower piezoelectricity compared with piezoelectric inorganic material.

In order to promote the piezoelectricity of piezoelectric polymer material, in 2008, Chunyan Li et al. issued a paper entitled "Flexible dome and bump shape piezoelectric tactile sensors using pvdf-trfe copolymer" (Journal of Microelectromechanical Systems, Vol. 17, pp. 334-340, 2008), which is related to a PVDF-TrFE (poly(vinylidenefluoride-co-trifluoroethylene)) thin film, in which a dome and bump micro-structure are formed on a PVDF-TrFE thin film for promoting the piezoelectric sensitivity of PVDF-TrFE.

In 2012, Rachid Hadji et al. issued a paper entitled "Preparation and Characterization of P(VDF-TrFE)/$Al_2O_3$ Nanocomposite" (IEEE TRANSACTIONS ON ULTRASONICS, FERROELECTRICS, AND FREQUENCY CONTROL, Vol. 59, No. 1, pp. 163-167, 2012). This paper disclosed a method for mixing PVDF-TrFE and an $Al_2O_3$ nanocomposite so as to promote the piezoelectricity of PVDF-TrFE.

Furthermore, mixing PVDF-TrFE and ZnO nanoparticles can also promote the piezoelectricity of PVDF-TrFE which was disclosed by John S. Dodds et al. in "Piezoelectric Characterization of PVDF-TrFE Thin Films Enhanced With ZnO Nanoparticles" (IEEE SENSORS JOURNAL, Vol. 12, No. 6, pp. 1889-1890, 2012).

However, piezoelectric material itself has no piezoelectricity when in a steady-state condition since the crystal lattices of piezoelectric material has spontaneous dipole moments which are mostly arranged in an unfixed direction, resulting in the cancellation between the dipole moments. Thus, a polarization process is used for enhancing or generating the piezoelectricity of piezoelectric material. Unpolarized piezoelectric material may be regarded as being simply a dielectric material.

Typically, the polarization process of a piezoelectric material thin film involves a method utilizing a high electric field parallel plate, in which the electric field of polarization of the piezoelectric material thin film is about 40-100 MV/m. However, an overly thick piezoelectric material thin film makes a higher electric field intensity necessary, and it may be difficult to provide a high electric field to polarize the piezoelectric material thin film with a higher electric field intensity. By contrast, it is easier to apply a lower electric field on a thinner piezoelectric material thin film. However, a subsequent micro/nanostructure process on the surface of the thinner piezoelectric material thin film makes the thinner piezoelectric material thin film puncture easily, resulting in a short between top and bottom electrodes on the piezoelectric material thin film.

The purpose of all the techniques described above relates to promoting the piezoelectricity of a PVDF-TrFE composite by mixing an inorganic piezoelectric powder and a PVDF-TrFE powder. However, it is difficult to uniformly mix the dried powder, and the internal electric property (such as capacitive and resistive character) of the PVDF-TrFE composite cannot be controlled.

SUMMARY

According to one embodiment of the present disclosure, a method for promoting an electric output of a piezoelectric/conductive hybrid polymer is provided. The method includes forming a piezoelectric/conductive hybrid polymer by mixing poly(vinylidene fluoride-trifluoroethylene) (PVDF-TrFE) and poly(3,4-ethylenedioxythiophene):poly(styrenesulfonate) (PEDOT:PSS) so as to increase an output current and an output power of the piezoelectric/conductive hybrid polymer; and changing a surface structure of the piezoelectric/conductive hybrid polymer by a nano-imprint process for promoting a piezoelectricity of the piezoelectric/conductive hybrid polymer. As a result, an output voltage, the output current and the output power of the piezoelectric/conductive hybrid polymer can be further increased.

According to another embodiment of the present disclosure, a method of fabricating a piezoelectric/conductive hybrid polymer thin film is provided, which is for promoting an electric output of a piezoelectric polymer. The method includes a mixing step, a filming step, and an annealing step. The mixing step includes forming a piezoelectric solution by dissolving PVDF-TrFE in an active solvent, forming a conductive solution by dissolving PEDOT:PSS in water, and forming a piezoelectric/conductive hybrid polymer solution by mixing the piezoelectric solution and the conductive solution. In the filming step, the piezoelectric/conductive hybrid polymer solution is heated, and thus, the piezoelectric/conductive hybrid polymer thin film is formed. In the annealing step, the piezoelectric/conductive hybrid polymer thin film is recrystallized and a nano-sized protruding structure is formed on a surface of the piezoelectric/conductive hybrid polymer thin film.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
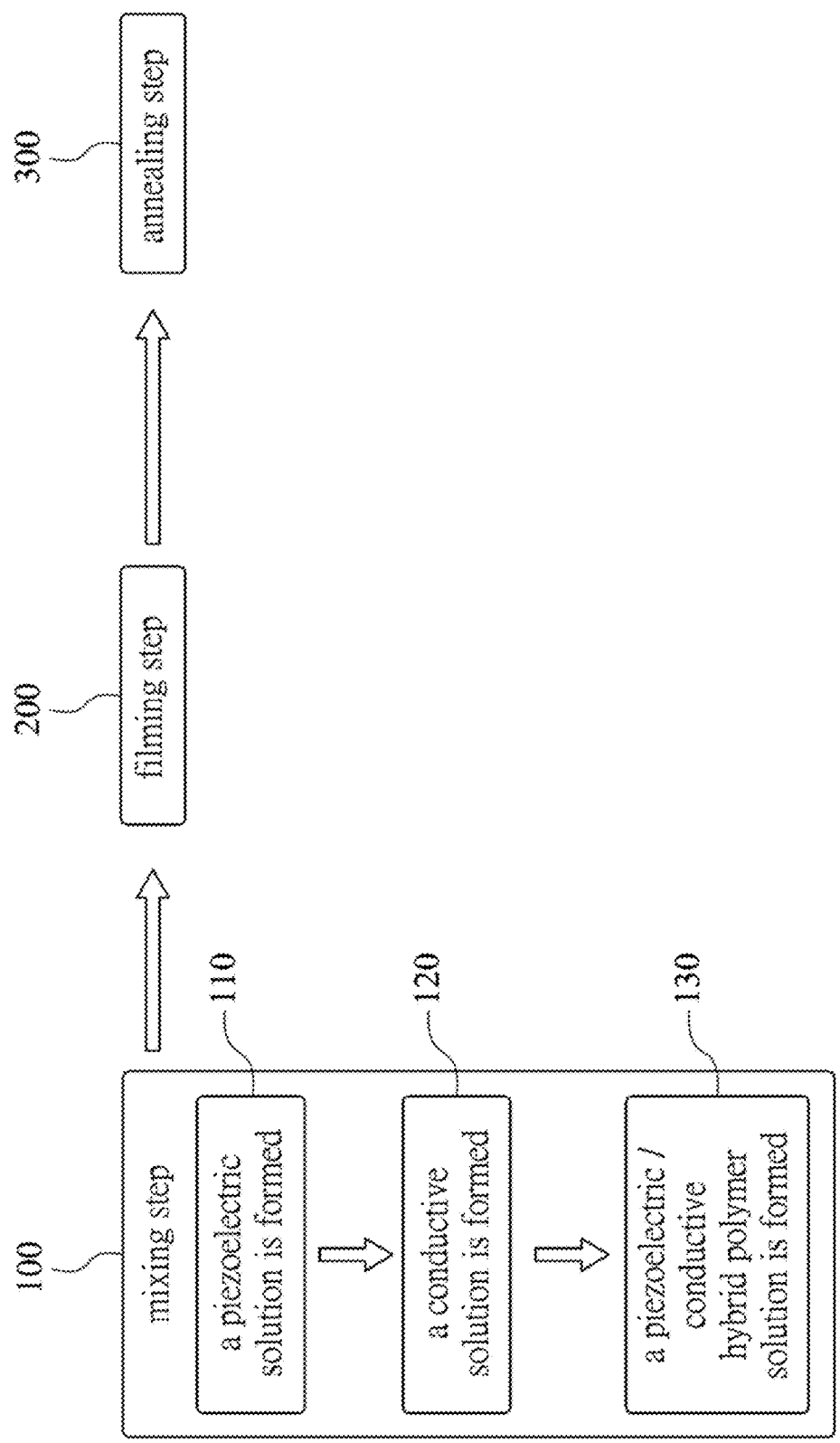
FIG. 1 is a flow chart illustrating a method of fabricating a piezoelectric/conductive hybrid polymer thin film according to an embodiment of the present disclosure.

FIG. 1 is a flow chart illustrating a method of fabricating a piezoelectric/conductive hybrid polymer thin film according to an embodiment of the present disclosure. In FIG. 1, the method of fabricating a piezoelectric/conductive hybrid polymer thin film is for promoting an electric output of a piezoelectric polymer and includes a mixing step 100, a filming step 200, and an annealing step 300.

The mixing step 100 includes a step 110, a step 120 and a step 130. In the step 110, a piezoelectric solution is formed by dissolving PVDF-TrFE in an active solvent, wherein PVDF-TrFE is heated at a temperature within a range of 70° C. to 80° C. and is stirred to be dissolved in the active solvent. In the step 120, a conductive solution is formed by dissolving PEDOT:PSS in water, wherein a weight percentage of PEDOT:PSS is 4.3% to 5.2% based on a weight percentage of the conductive solution being 100%. In the step 130, a piezoelectric/conductive hybrid polymer solution is formed by mixing the piezoelectric solution and the conductive solution, wherein a weight percentage range of PEDOT:PSS is 0.78% to 2% based on a weight percentage of the piezoelectric/conductive hybrid polymer solution being 100%.

In greater detail, PEDOT:PSS is mixed into PVDF-TrFE according to the "like dissolve like" principle. In the "like dissolve like" principle, the polarity of the solvent determines whether a substance or a solvent is dissolved therein. The permittivity of butanone is 18.5 by a measurement of the dielectric constant or the electric dipole moment. The mutual solubility between PEDOT:PSS and PVDF-TrFE is poor when PEDOT:PSS is mixed directly with PVDF-TrFE. However, the permittivity of water is 80.1, which allows PEDOT:PSS and water to be completely dissolved with each other, and moreover, it is known that water and butanone can be completely dissolved with each other. Therefore, the piezoelectric solution is formed by dissolving PVDF-TrFE in butanone and water as a third-party solvent to solve the problem related to the immiscibility of butanone and PEDOT:PSS. Therefore, the piezoelectric/conductive hybrid polymer solution can be formed by mixing PEDOT:PSS and PVDF-TrFE.

The filming step 200 is for heating the piezoelectric/conductive hybrid polymer solution, and thus, the active solvent and water are vaporized to form the piezoelectric/conductive hybrid polymer thin film, wherein the active solvent can be butanone described above. In the filming step 200, the piezoelectric/conductive hybrid polymer solution is heated and cured by a casting process to form the piezoelectric/conductive hybrid polymer thin film. An insulating substrate is covered by an electrode as a carrier of the casting process for a subsequent experiment. Specifically, the piezoelectric/conductive hybrid polymer solution of the mixing step 100 is cast on the carrier and heated to 80° C. for 1 minute to evaporate butanone, and then gradiently heated to 100° C. to evaporate water, in which a curing film formation time of the piezoelectric/conductive hybrid polymer thin film may be 30 seconds to 3 minutes. The above is based on film forming abilities of PVDF-TrFE and the differences of the boiling point between butanone and water. In order to avoid the problem of forming film on the surface of the piezoelectric/conductive hybrid polymer thin film caused by boiling with vapor-liquid phase transition too violent, the temperature is heated from 80° C. to 90° C. for 1 minute after the evaporation of butanone, and then the temperature is heated to 100° C. for 1 minute to reach the boiling point of water, and water is evaporated.

Figure 2:
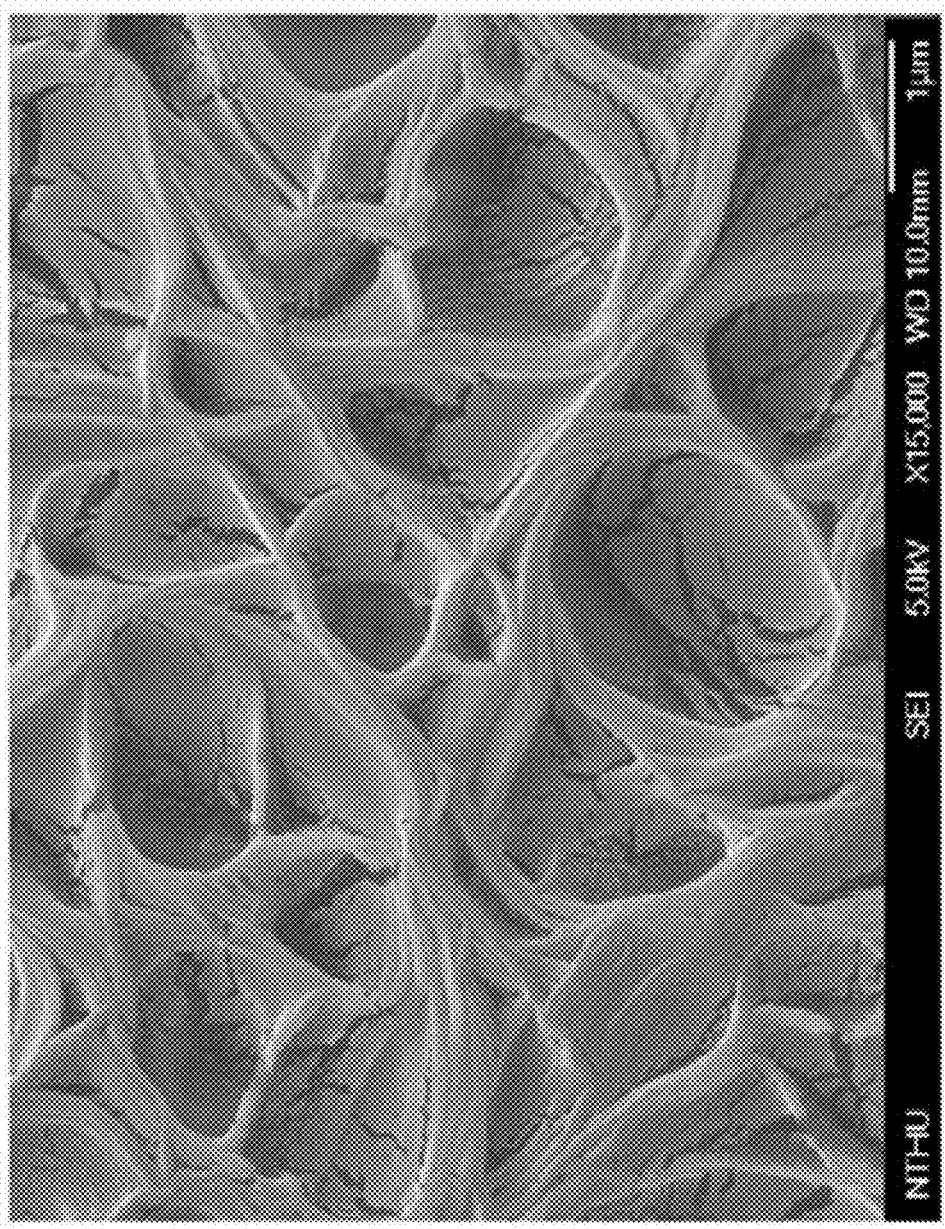
FIG. 2 is a surface morphology diagram of the piezoelectric/conductive hybrid polymer thin film of FIG. 1.

In the annealing step 300, the piezoelectric/conductive hybrid polymer thin film is recrystallized at a recrystallization temperature between a Curie point (Tc) 120° C. and a melting point (Tm) 142° C. for 2 hours to 5 hours, thereby changing a crystallinity of the piezoelectric/conductive hybrid polymer thin film. FIG. 2 is a surface morphology diagram of the piezoelectric/conductive hybrid polymer thin film fabricated by the method of FIG. 1, wherein the surface morphology diagram is captured by a SEM (Scanning Electronic Microscope). In FIG. 2, a nano-sized protruding structure is formed on the surface of the piezoelectric/conductive hybrid polymer thin film, in which a maximum width of a protruding part of the nano-sized protruding structure is 300 nm to 500 nm. Also, a thickness of the piezoelectric/conductive hybrid polymer thin film is 10 um to 10000 um.

The following describes an analysis of experiment data according to the abovementioned embodiments, and provides proof of an efficacy of the present disclosure fabricating process of the piezoelectric/conductive hybrid polymer thin film. It is noted that the experimental samples are fabricated by the method of fabricating the piezoelectric/conductive hybrid polymer thin film according to the present disclosure, and the fabricating parameters and conditions are as follows: the curing film formation time of the piezoelectric/conductive hybrid polymer thin film is 3 minutes in the filming step 200. The recrystallization temperature is 140° C. for 2 hours in the annealing step 300. Only a mixing concentration of PVDF-TrFE and PEDOT:PSS is used as a variable in the step 130.

Figure 3:
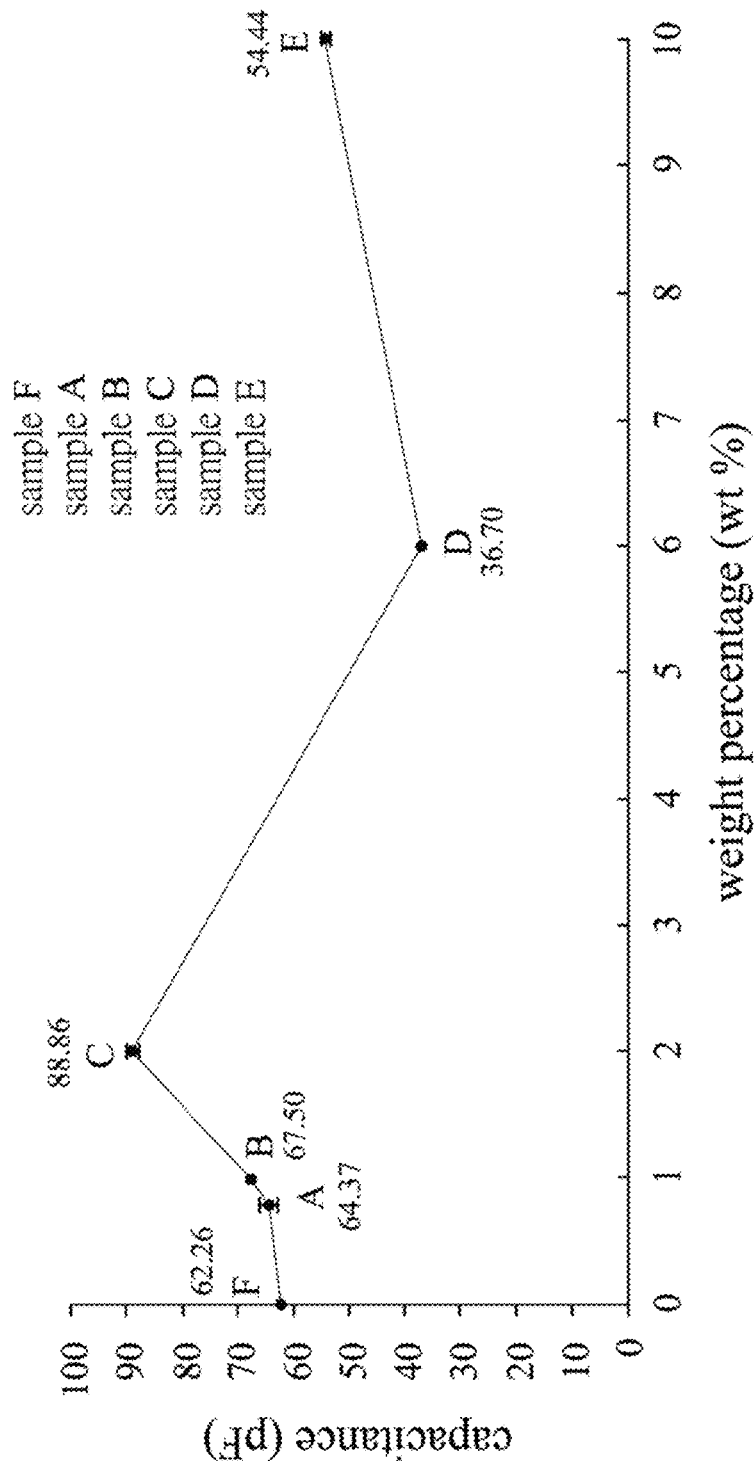
FIG. 3 is a curve chart illustrating capacitance (pF)-weight percentage (wt %) of samples A-F.
Figure 4:
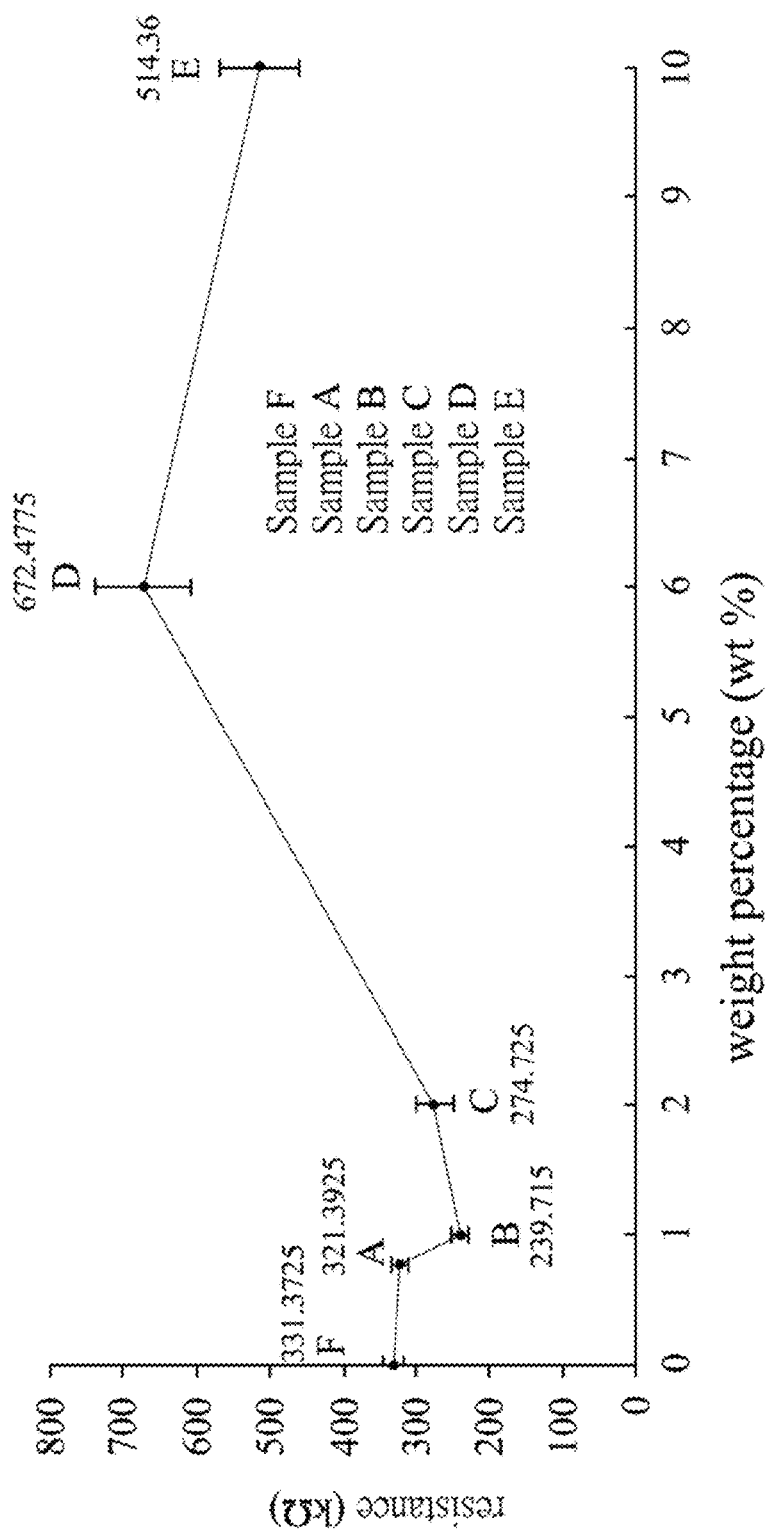
FIG. 4 is a curve chart illustrating resistance (kΩ)-weight percentage (wt %) of samples A-F.

FIG. 3 is a curve chart illustrating capacitance (pF)-weight percentage (wt %) of samples A-F. FIG. 4 is a curve chart illustrating resistance (kΩ)-weight percentage (wt %) of samples A-F. Analysis of variable weight percentage (wt %) of the capacitance and the resistance of the piezoelectric/conductive hybrid polymer thin film in which PVDF-TrFE and PEDOT:PSS are mixed is taken by an impedance analyzer with a frequency of 500 Hz. The weight percentages of PEDOT:PSS of samples A-F are listed in TABLE 1 below, wherein the weight percentages of PEDOT:PSS are based on a weight percentage of the piezoelectric/conductive hybrid polymer solution being 100%.

TABLE 1

| Sample | PEDOT:PSS (wt %) |
| --- | --- |
| Sample A | 0.78 |
| Sample B | 1 |
| Sample C | 2 |
| Sample D | 6 |
| Sample E | 10 |
| Sample F | 0 |

In FIG. 3 and FIG. 4, the capacitance of sample F is 62.3 pF, and the resistance of sample F is 331.37 KΩ. The capacitance of sample B and sample C is up to 67.5 pF and 88.9 pF, the resistance of sample B and sample C is 239.72 KΩ and 274.73 KΩ, and the capacitive reactance of sample B and sample C is 4.72 MΩ and 3.58 MΩ. The resistance of sample D and sample E should be decreased due to the high weight percentage of PEDOT:PSS. However, a plurality of pores on the piezoelectric/conductive hybrid polymer thin film are formed during the annealing step 300, so that the resistance is increased.

The crystallinity of the piezoelectric/conductive hybrid polymer thin film with variable concentration conditions (weight percentage) of PEDOT:PSS is analyzed by XRD (X-ray Diffraction). The technology of XRD is well known to those of ordinary skill in the art, and will not be described particularly herein. The results in diffraction analysis with XRD are listed in TABLE 2 and TABLE 3 below as follows:

TABLE 2

| Sample (weight percentage of PEDOT:PSS) | 2θ (degree) |
| --- | --- |
| Sample A (0.78 wt %) | 20.12 |
| Simple B (1 wt %) | 20.14 |
| Simple C (2 wt %) | 20.04 |
| Simple D (6 wt %) | Unshown |
| Simple E (10 wt %) | Unshown |
| Simple F (0 wt %) | 20.20 |

According to TABLE 2, no peak is expressed as 2θ angle position of sample D and sample E, that is, sample D and sample E are not crystallized with a beta crystalline phase. All of sample A, sample B, sample C and sample F have peaks at the same angle position (2θ, is about 20°), that is, sample A, sample B, sample C and sample F are crystallized with the beta crystalline phase. The magnitude and the shift of the peak change with the weight percentage of PEDOT:PSS in the piezoelectric/conductive hybrid polymer thin film.

TABLE 3

| Sample (weight percentage of PEDOT:PSS) | FWHM (degree) | Grain size (nm) |
| --- | --- | --- |
| Sample A (0.78 wt %) | 0.80 | 1.9 |
| Sample B (1 wt %) | 0.82 | 1.9 |
| Sample C (2 wt %) | 0.98 | 1.6 |
| Sample F (0 wt %) | 0.72 | 2.1 |

According to TABLE 3, the larger grain size of the crystal, the narrower FWHM (Full Width half Maximum) of the peak, that is, a higher crystallinity of the piezoelectric/conductive hybrid polymer thin film is obtained.

Figure 5:
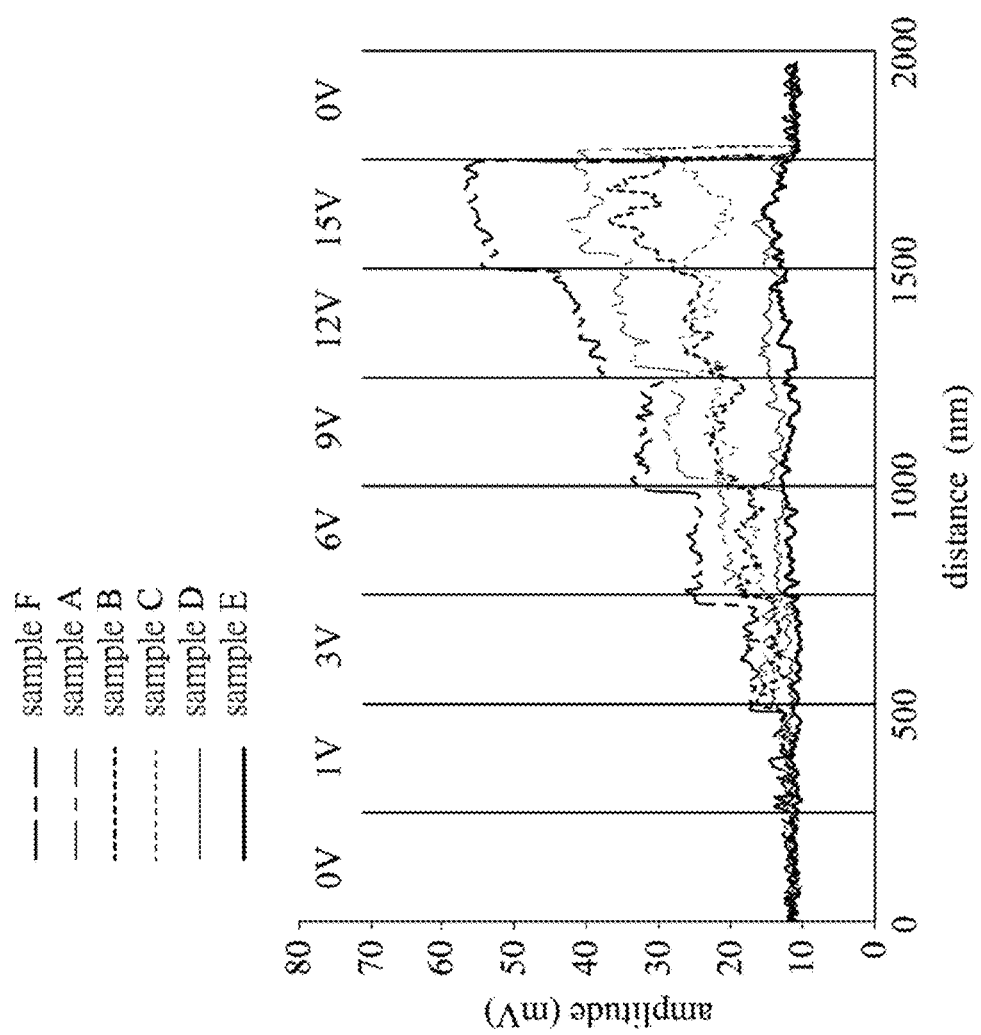
FIG. 5 is a curve chart illustrating amplitude (mV)-distance (nm) of sample A-F.

The piezoelectricity of the piezoelectric/conductive hybrid polymer thin film with variable concentration conditions (weight percentage) of PEDOT:PSS is analyzed by PFM (Piezorespnse Force Microscopy). FIG. 5 is a curve chart illustrating amplitude (mV)-distance (nm) of sample A-F. An increase in the weight percentage of PEDOT:PSS results in a decrease in an inverse piezoelectricity of the piezoelectric/conductive hybrid polymer thin film. That is, the inverse piezoelectricity of the piezoelectric/conductive hybrid polymer thin film is decreased because of mixing with PEDOT:PSS.

The following analysis relates to the measuring of direct piezoelectric signals and output current signals of the piezoelectric/conductive hybrid polymer thin film with a vibration of a motor involving adjustment of the voltage to control the vibration frequency, thereby allowing the piezoelectricity of the piezoelectric/conductive hybrid polymer thin film to be measured.

The vibration frequency of the motor is set at 250 Hz, and the samples in addition to the abovementioned samples A-F are listed in the TABLE 4 below as follows:

TABLE 4

| Sample | PEDOT:PSS (wt %) |
| --- | --- |
| Sample G | 100 |
| Sample H | 0.5 |
| Sample I | 0.5 |
| Sample J | 0.9 |

In addition, the best concentration condition (weight percentage) of PEDOT:PSS in the piezoelectric/conductive hybrid polymer thin film can be obtained by an EA (Electrochemical Analyzer).

Figure 6:
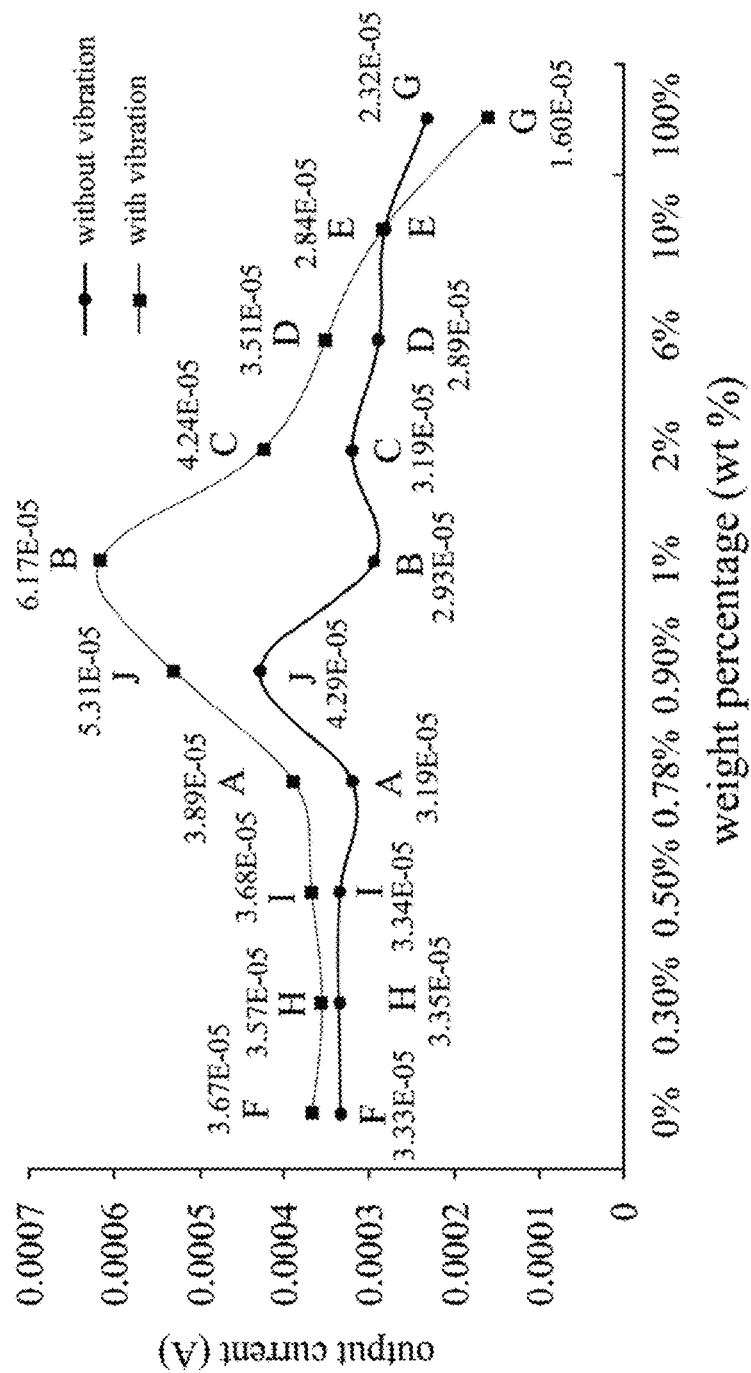
FIG. 6 is a curve chart illustrating output current (A)-weight percentage (wt %) of sample A-J with/without a vibration of a motor.

FIG. 6 is a curve chart illustrating output current (A)-weight percentage (wt %) of sample A-J with/without a vibration of a motor. The results in FIG. 6 provide proof that adding PEDOT:PSS to PVDF-TrFE can decrease the original high resistance of PVDF-TrFE to thereby enhance the output current. It also shows that the best concentration condition (weight percentage) of PEDOT:PSS in the piezoelectric/conductive hybrid polymer thin film is 1 wt % of sample B, in which the output current is 214 nA. The output current is increased from 111 nA to 214 nA due to an initial vibration current of the motor being 111 nA.

Figure 7:
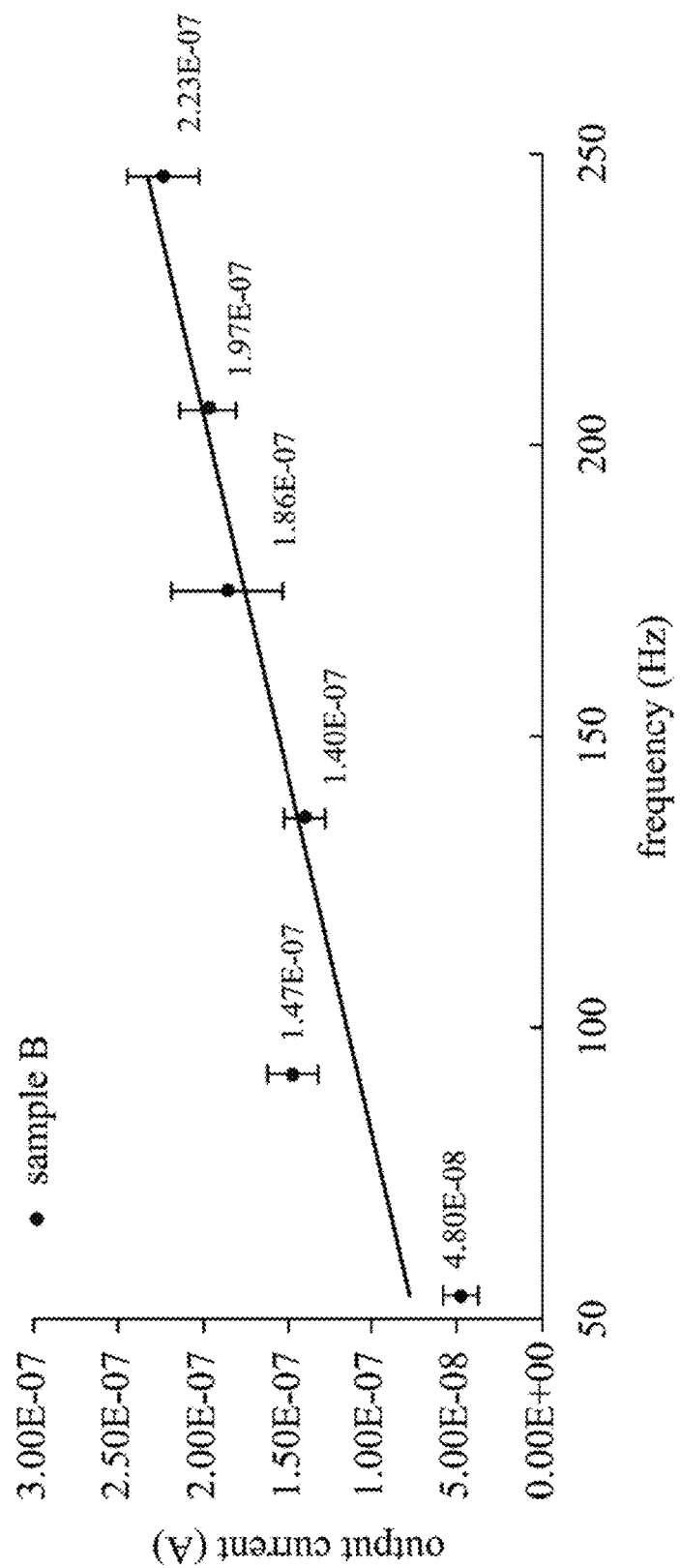
FIG. 7 is a curve chart illustrating output current (A)-frequency (Hz) of sample B.
Figure 8:
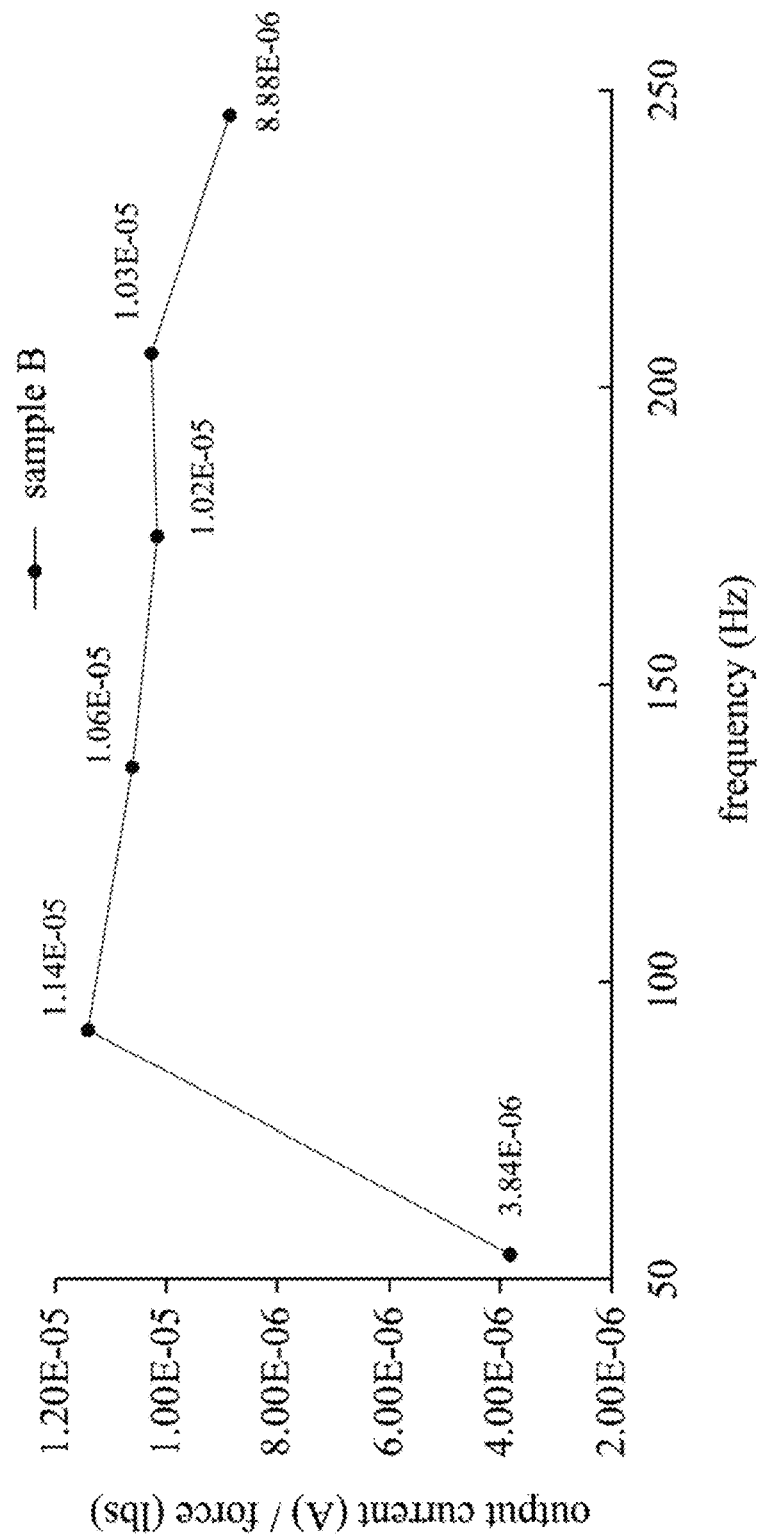
FIG. 8 is a curve chart illustrating normalized output current with a unit of force (A/lbs)-frequency (Hz) of sample B of FIG. 7.

FIG. 7 is a curve chart illustrating output current (A)-frequency (Hz) of sample B. FIG. 8 is a curve chart illustrating normalized output current with a unit of force (A/lbs)-frequency (Hz) of sample B of FIG. 7. In order to obtain a frequency in accordance with a maximum output current of sample B, a sensor is used to sense forces with variable vibration frequencies from the motor, and the output current in FIG. 7 is divided by the forces with variable vibration frequencies. The output current of sample B reaches a maximum variation when the vibration frequency of the motor is 92 Hz.

Figure 9:
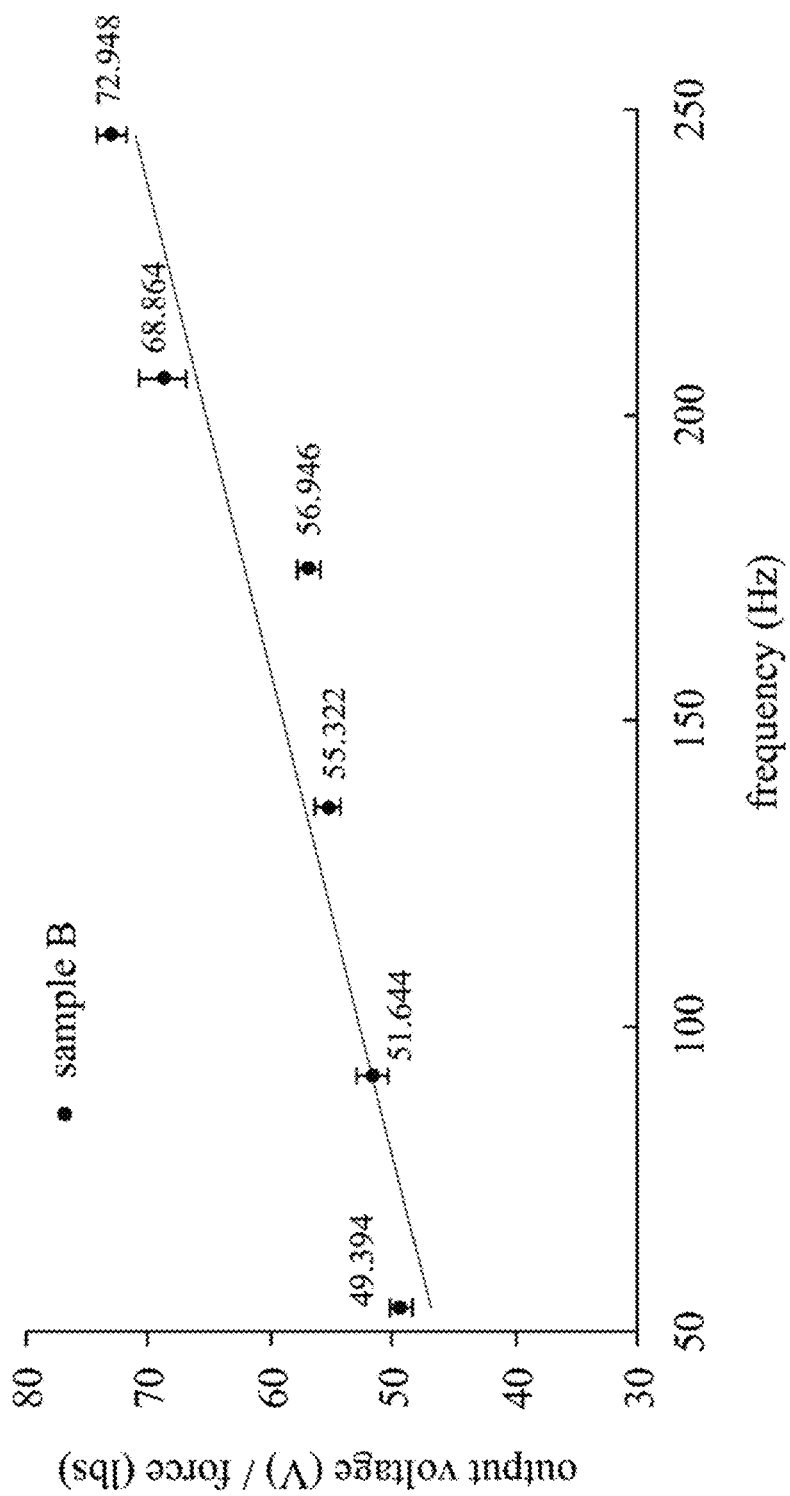
FIG. 9 is a curve chart illustrating output voltage (V)-frequency (Hz) of sample B.
Figure 10:
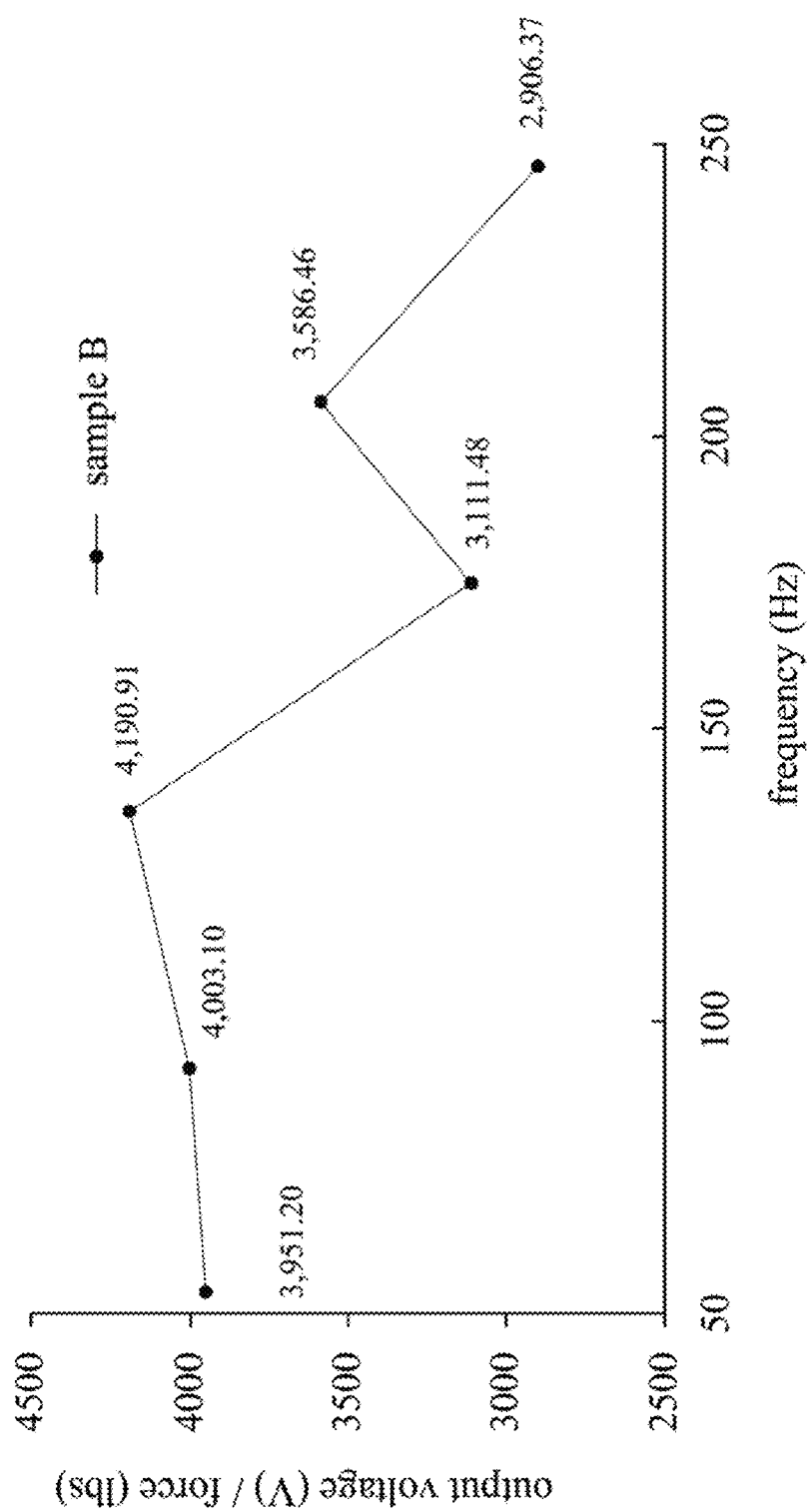
FIG. 10 is a curve chart illustrating normalized output voltage with a unit of force (V/lbs)-frequency (Hz) of sample B of FIG. 9.

FIG. 9 is a curve chart illustrating output voltage (V)-frequency (Hz) of sample B. FIG. 10 is a curve chart illustrating normalized output voltage with a unit of force (V/lbs)-frequency (Hz) of sample B of FIG. 9. In order to obtain a frequency in accordance with a maximum output voltage of sample B, the output voltage in FIG. 9 is divided by the abovementioned forces with variable vibration frequencies. The output voltage of sample B reaches a maximum variation when the vibration frequency of the motor is 136 Hz.

Figure 11:
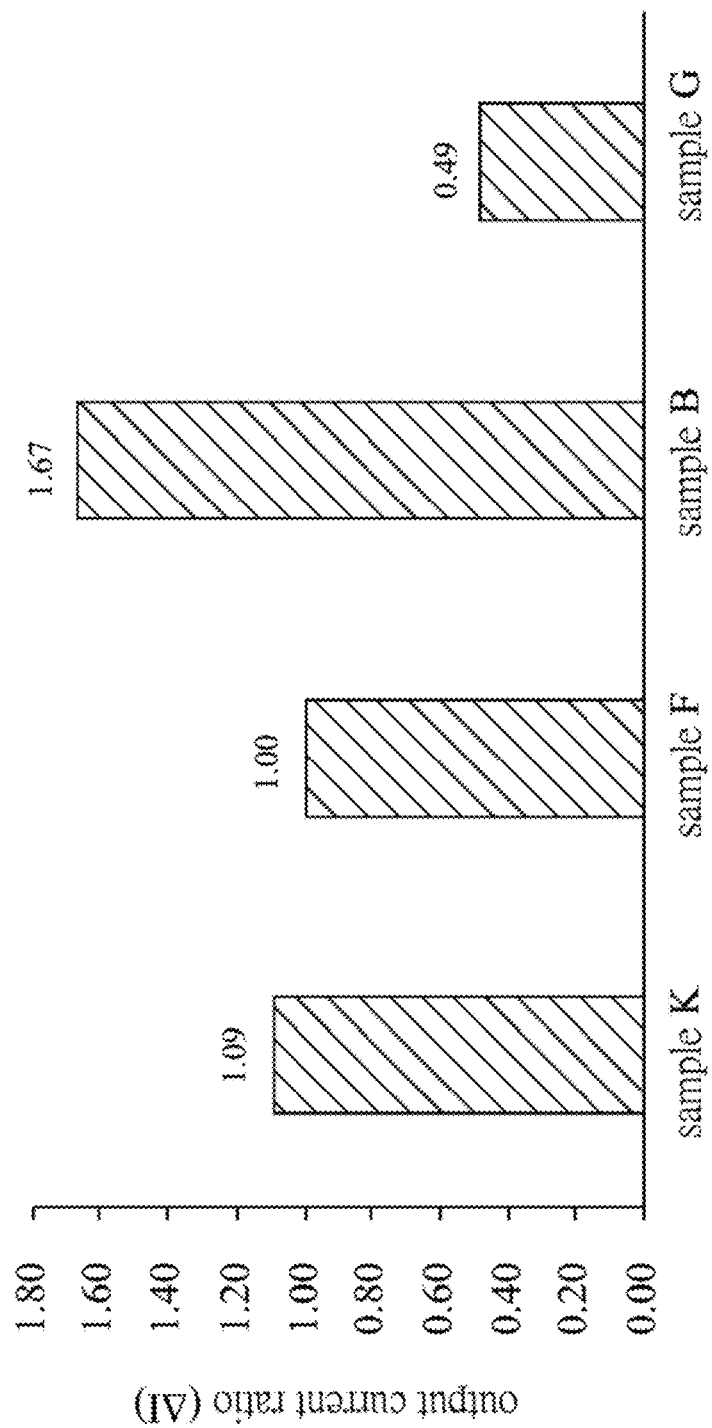
FIG. 11 is a bar chart illustrating output current ratios (ΔI) of sample B, sample F, sample G, and sample K, wherein the output current ratios of sample B, sample F, sample G, and sample K are based on an output current ratio of sample F being 1.
Figure 12:
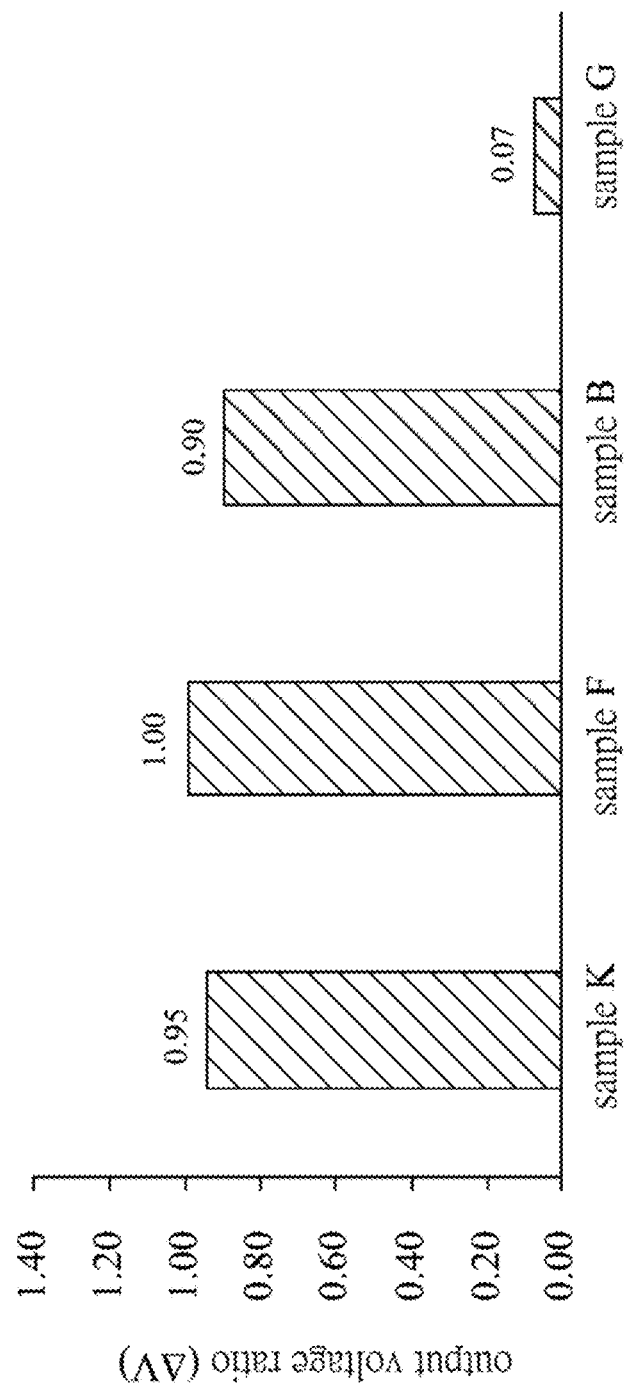
FIG. 12 is a curve chart illustrating output voltage ratios (ΔV) of sample B, sample F, sample G, and sample K, wherein the output voltage ratios of sample B, sample F, sample G, and sample K are based on an output voltage ratio of sample F being 1.

FIG. 11 is a bar chart illustrating output current ratios (ΔI) of sample B, sample F, sample G, and sample K, wherein the output current ratios of sample B, sample F, sample G, and sample K are based on an output current ratio of sample F being 1. FIG. 12 is a bar chart illustrating output voltage ratios (ΔV) of sample B, sample F, sample G, and sample K, wherein the output voltage ratios of sample B, sample F, sample G, and sample K are based on an output voltage ratio of sample F being 1. Thus, the abovementioned results demonstrate that an efficiency of the piezoelectricity depends on the variable concentration (weight percentage) conditions of the piezoelectric/conductive hybrid polymer thin film. In the results of FIG. 11, the output current of the sample B is increased by 1.67 times. In the results of FIG. 12, the out voltage of the sample B is decreased by 0.9 times. That is a sacrifice of the piezoelectricity of PVDF-TrFE results in a reduction in a collision between the free electrons, and therefore, both the conductivity and the output current of PVDF-TrFE are increased. However, the overall efficiency of sample B is 1.45 times higher than the overall efficiency of sample K, and is 1.5 times higher than the overall efficiency of sample F.

The following analysis relates to the measuring of direct piezoelectric signals of the piezoelectric/conductive hybrid polymer thin film by a preset force from a cantilever applying on thereof, as the piezoelectric/conductive hybrid polymer thin film is forced by the cantilever involving adjustment of a height between the cantilever and the piezoelectric/conductive hybrid polymer thin film to control the preset force. Therefore, the piezoelectricity of the piezoelectric/conductive hybrid polymer thin film can be obtained. In order to perform this analysis, a predetermined height must be set between the cantilever and the piezoelectric/conductive hybrid polymer thin film. When the cantilever is lifted to the predetermined height and then released, a potential energy of the cantilever is converted to a kinetic energy as the preset force on the piezoelectric/conductive hybrid polymer thin film.

Figure 13:
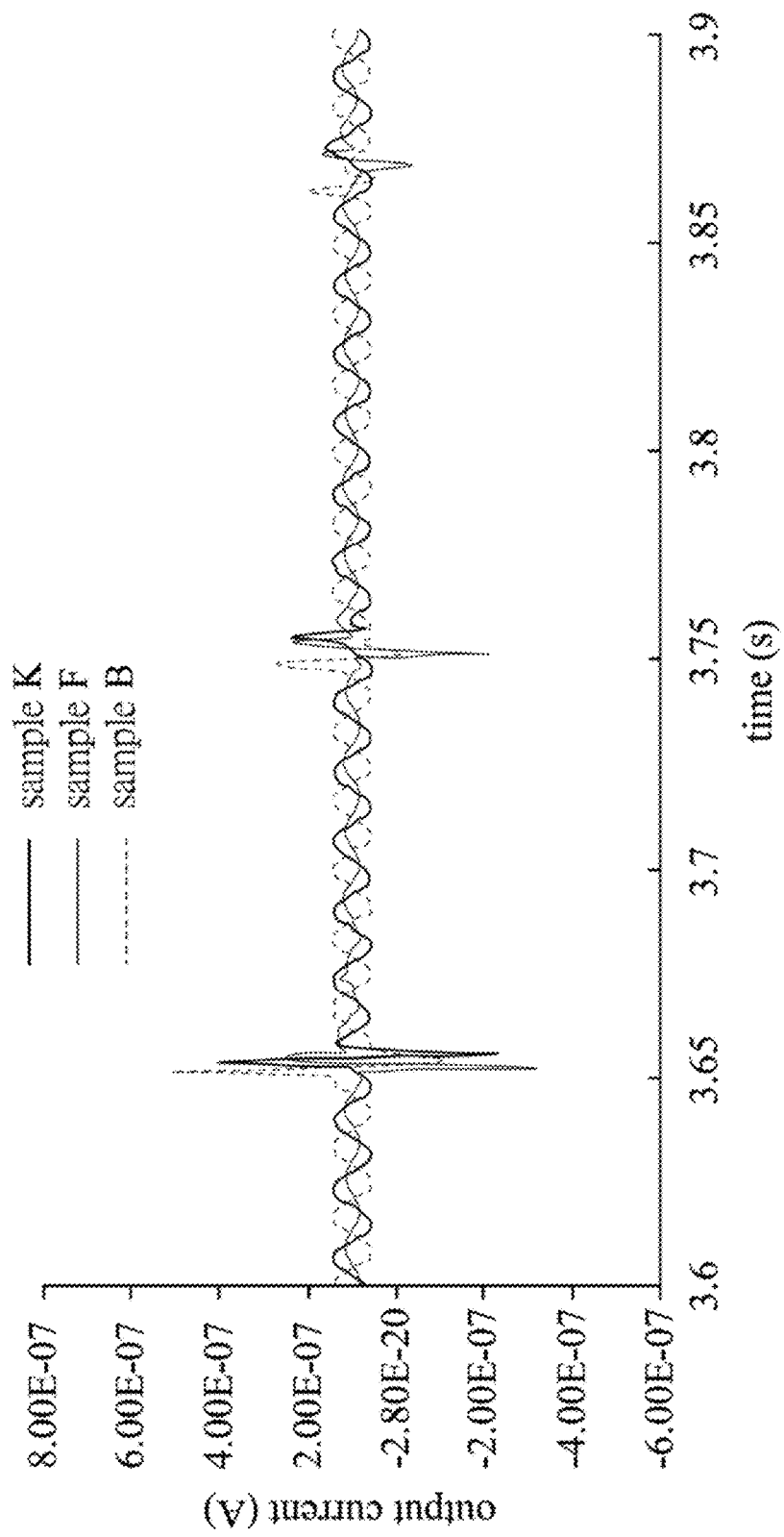
FIG. 13 is a curve chart illustrating output current (A)-times (s) of sample B, sample F, and sample K, which is forced by the cantilever with 99.86 mN.

A maximum of the preset force which the cantilever provided herein is 99.86 mN, and the maximum force is applied to sample B, sample F, and sample K. FIG. 13 is a curve chart illustrating output current (A)-times (s) of sample B, sample F, and sample K, which is forced by the cantilever with 99.86 mN. Output voltages (not shown) should be measured before an experiment of the output current of the sample B, sample F, and sample K. As a result, the output current of the sample K is 635 nA at the output voltage which is 745 mV. The output current of the sample F is 583 nA at the output voltage which is 845 mV, and the output current of the sample B is 630 nA at the output voltage which is 788 mV.

Figure 14:
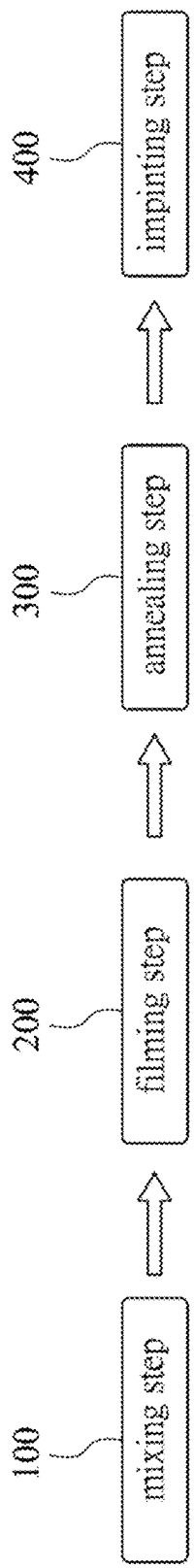
FIG. 14 is a flow chart illustrating a method of fabricating a piezoelectric/conductive hybrid polymer thin film according to another embodiment of the present disclosure.
Figure 15:
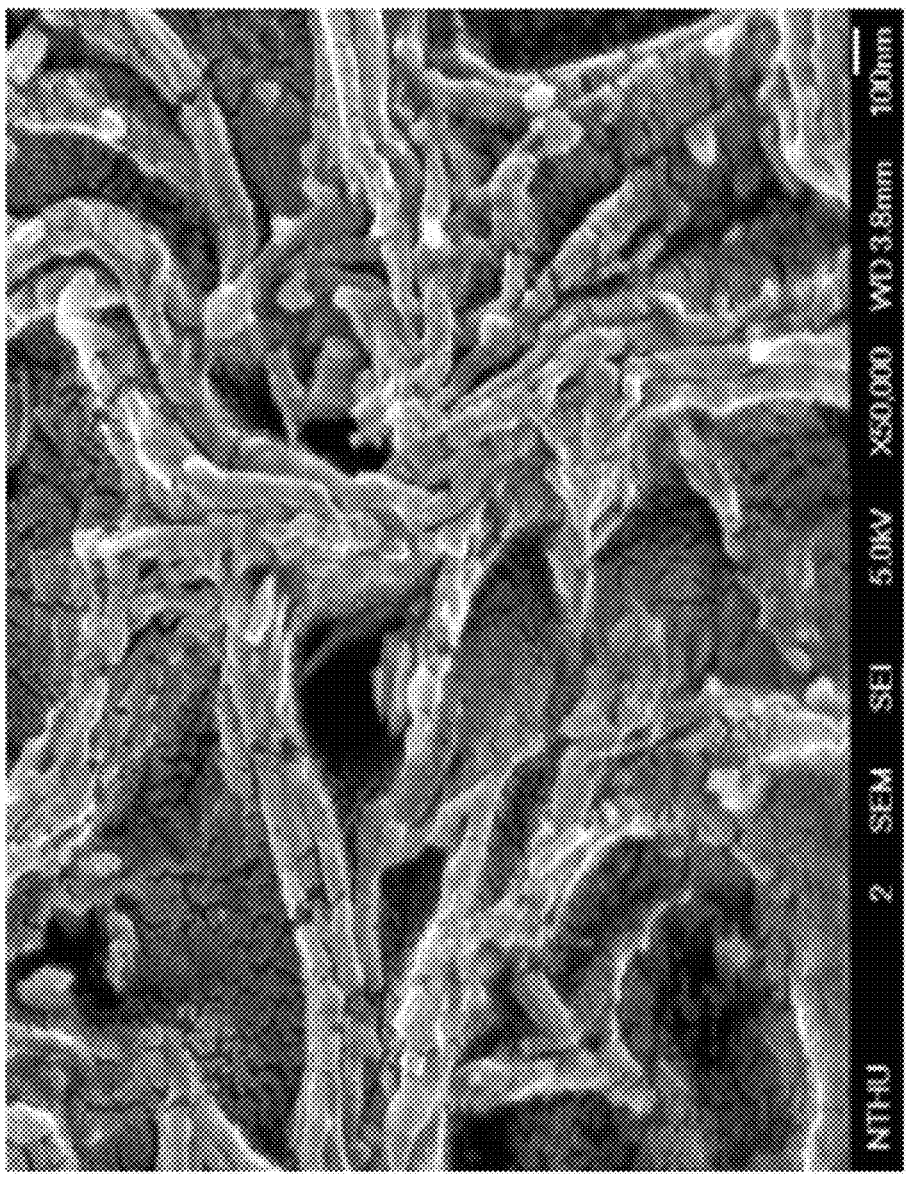
FIG. 15 is a surface morphology view of nanograss of the piezoelectric/conductive hybrid polymer thin film of FIG. 14.

FIG. 14 is a flow chart illustrating a method of fabricating a piezoelectric/conductive hybrid polymer thin film according to another embodiment of the present disclosure. FIG. 15 is a surface morphology view of nanograss of the piezoelectric/conductive hybrid polymer thin film of FIG. 14. The method in FIG. 14 further includes an imprinting step 400 which is performed after the annealing step 300. In order to promote the piezoelectricity of the piezoelectric/conductive hybrid polymer thin film, in which nanograss is formed on the nano-sized protruding structure of the surface of the piezoelectric/conductive hybrid polymer thin film by imprinting the nano-sized protruding structure of the surface of the piezoelectric/conductive hybrid polymer thin film. In greater detail, the imprinting step 400 is performed by a thermal nanoimprinting mold process to form nanograss on the nano-sized protruding structure of the surface of the piezoelectric/conductive hybrid polymer thin film, in which a height of nanograss is sub-20 nm (as shown in FIG. 15).

A method of the thermal nanoimprinting mold process which is applied on sample B as sample B' includes performing a fluorination for a mold with a nanograss structure, and then imprinting the mold on the surface of the piezoelectric/conductive hybrid polymer thin film with uniform heating and pressurizing, thereby forming the piezoelectric/conductive hybrid polymer thin film with nanograss. The mold surface has a cover layer of fluorine, and a contact angle between the mold and the piezoelectric/conductive hybrid polymer thin film becomes larger, so that an adhesive force between the mold and the piezoelectric/conductive hybrid polymer thin film will be decreased.

Figure 16:
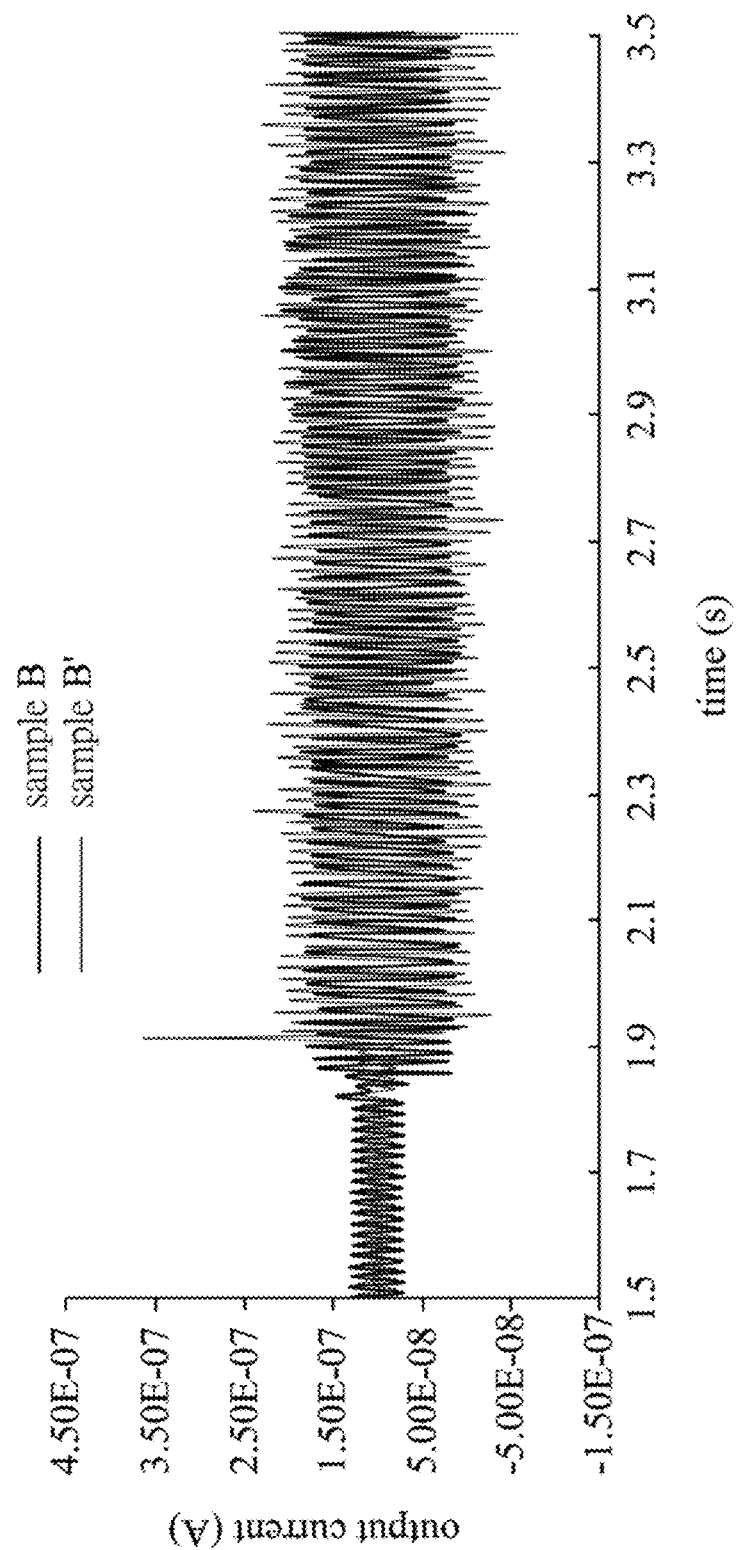
FIG. 16 is a curve chart illustrating output current (A)-times (s) of sample B (without nanograss) and sample B' (with nanograss).
Figure 17:
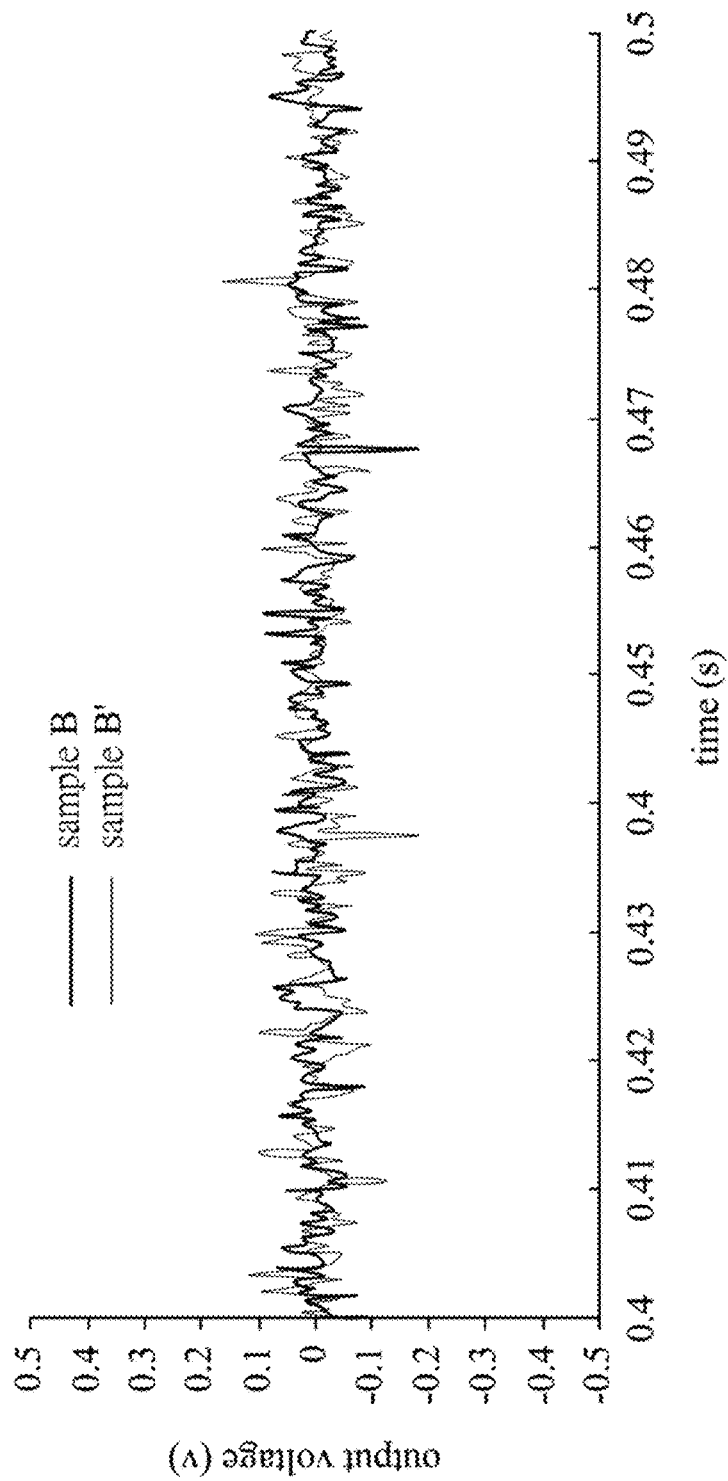
FIG. 17 is a curve chart illustrating output voltage (V)-times (s) of sample B (without nanograss) and sample B' (with nanograss).

Furthermore, the output current and the output voltage piezoelectric/conductive hybrid polymer thin film with nanograss on the nano-sized protruding structure of the surface are analyzed by the abovementioned method with the vibration of the motor. FIG. 16 is a curve chart illustrating output current (A)-times (s) of sample B (without nanograss) and sample B' (with nanograss). FIG. 17 is a curve chart illustrating output voltage (V)-times (s) of sample B (without nanograss) and sample B' (with nanograss). As a result, the output voltage of sample B is 0.212 V, and the output voltage of sample B' is increased to 0.265 V. The output current of sample B is 214 nA, and the output current of sample B' is increased to 304 nA.

Figure 18:
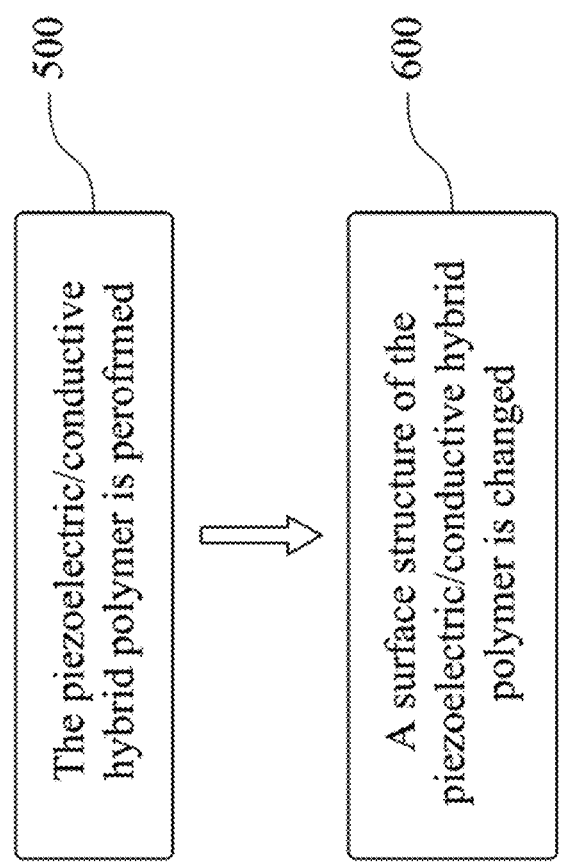
FIG. 18 is a flow chart illustrating a method for promoting an electric output of a piezoelectric/conductive hybrid polymer according to an embodiment of the present disclosure.

FIG. 18 is a flow chart illustrating a method for promoting an electric output of a piezoelectric/conductive hybrid polymer according to an embodiment of the present disclosure. In FIG. 18, the method for promoting an electric output of a piezoelectric/conductive hybrid polymer is provided, and the method includes a step 500 and a step 600. In the step 500, the piezoelectric/conductive hybrid polymer is formed by mixing poly(vinylidene fluoride-trifluoroethylene)

(PVDF-TrFE) and poly(3,4-ethylenedioxythiophene):poly(styrenesulfonate) (PEDOT:PSS) so as to increase an output current and an output power of the piezoelectric/conductive hybrid polymer. In the step 600, a surface structure of the piezoelectric/conductive hybrid polymer is changed by a nano-imprint process for promoting a piezoelectricity of the piezoelectric/conductive hybrid polymer. As a result, an output voltage, the output current and the output power of the piezoelectric/conductive hybrid polymer can be increased. However, in the step 500, although PEDOT:PSS decreases the piezoelectricity of the piezoelectric/conductive hybrid polymer, the output current and the overall output power of the piezoelectric/conductive hybrid polymer are still increased.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of fabricating a piezoelectric/conductive hybrid polymer thin film, which is for promoting an electric output of a piezoelectric/conductive polymer, the method comprising:
    a mixing step, comprising:
        forming a piezoelectric solution by dissolving poly(vinylidene fluoride-trifluoroethylene) (PVDF-TrFE) in an active solvent;
        forming a conductive solution by dissolving poly(3,4-ethylenedioxythiophene):poly(styrenesulfonate) (PEDOT:PSS) in water; and
        forming a piezoelectric/conductive hybrid polymer solution by mixing the piezoelectric solution and the conductive solution;
    a filming step, wherein the piezoelectric/conductive hybrid polymer solution is heated, thus the piezoelectric/conductive hybrid polymer thin film is formed; and
    an annealing step, wherein the piezoelectric/conductive hybrid polymer thin film is recrystallized, and a nano-sized protruding structure is formed on a surface of the piezoelectric/conductive hybrid polymer thin film.

2. The method of claim 1, wherein after the annealing step, the method further comprises:
    an imprinting step, wherein a nanograss is formed on the nano-sized protruding structure of the piezoelectric/conductive hybrid polymer thin film.

3. The method of claim 2, wherein the imprinting step is performed by a thermal nanoimprinting mold process to form the nanograss on the nano-sized protruding structure on the surface of the piezoelectric/conductive hybrid polymer thin film, wherein a height of the nanograss is sub-20 nm.

4. The method of claim 1, wherein the active solvent is a butanone solvent.

5. The method of claim 4, wherein the PVDF-TrFE is dissolved in the active solvent at a temperature from 70° C. to 80° C.

6. The method of claim 5, wherein a weight percentage range of the PEDOT:PSS is 4.3% to 5.2% based on a weight percentage of the conductive solution being 100%.

7. The method of claim 6, wherein the weight percentage of the PEDOT:PSS in the conductive solution is 4.77%.

8. The method of claim 4, wherein a weight percentage range of the PEDOT:PSS is 0.78% to 2% based on a weight percentage of the piezoelectric/conductive hybrid polymer solution being 100%.

9. The method of claim 8, wherein a weight percentage of PEDOT:PSS in the piezoelectric/conductive hybrid polymer solution is 1%.

10. The method of claim 9, wherein the filming step is performed by heating the piezoelectric/conductive hybrid polymer solution at a temperature of 80° C. for a vaporization of the butanone solvent, and gradiently heating the piezoelectric/conductive hybrid polymer solution at a temperature from 80° C. to 100° C. for a vaporization of the water.

11. The method of claim 10, wherein the filming step is performed by a casting process.

12. The method of claim 11, wherein the filming step is performed for 30 seconds to 3 minutes.

13. The method of claim 12, wherein the filming step is performed for 3 minutes.

14. The method of claim 1, wherein the annealing step is performed by heating the piezoelectric/conductive hybrid polymer thin film at a recrystallization temperature between a Curie point (Tc) and a melting point (Tm).

15. The method of claim 14, wherein the recrystallization temperature is 140° C.

16. The method of claim 15, wherein the annealing step is performed at the recrystallization temperature for 2 hours to 5 hours.

17. The method of claim 16, wherein the annealing step is performed at the recrystallization temperature for 2 hours.

18. The method of claim 1, wherein a thickness of the piezoelectric/conductive hybrid polymer thin film is 10 um to 10000 um.

* * * * *